United States Patent
Chang et al.

(10) Patent No.: US 12,145,842 B2
(45) Date of Patent: Nov. 19, 2024

(54) GA-BASED VAN DER WAALS ROOM-TEMPERATURE FERROMAGNETIC CRYSTAL MATERIAL, PREPARATION AND USE THEREOF

(71) Applicant: HUAZHONG UNIVERSITY OF SCIENCE AND TECHNOLOGY, Hubei (CN)

(72) Inventors: Haixin Chang, Hubei (CN); Gaojie Zhang, Hubei (CN); Hao Wu, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/273,780

(22) PCT Filed: Dec. 3, 2022

(86) PCT No.: PCT/CN2022/136400
§ 371 (c)(1),
(2) Date: Jul. 24, 2023

(87) PCT Pub. No.: WO2024/016560
PCT Pub. Date: Jan. 25, 2024

(65) Prior Publication Data
US 2024/0262687 A1    Aug. 8, 2024

(30) Foreign Application Priority Data

Jul. 19, 2022    (CN) .......................... 202210849612.2

(51) Int. Cl.
*C01B 19/00*    (2006.01)
*B82Y 25/00*    (2011.01)
(Continued)

(52) U.S. Cl.
CPC .............. *C01B 19/002* (2013.01); *C30B 9/06* (2013.01); *C30B 29/46* (2013.01); *H01F 1/147* (2013.01);
(Continued)

(58) Field of Classification Search
CPC ........ C01B 19/007; B82Y 25/00; H01F 1/147
See application file for complete search history.

(56) References Cited

U.S. PATENT DOCUMENTS

2008/0115864 A1    5/2008    Flatau et al.
2023/0335325 A1*   10/2023   Singh ................... G11C 11/18

FOREIGN PATENT DOCUMENTS

CN    1501410       6/2004
CN    111593402     8/2020
(Continued)

OTHER PUBLICATIONS

Gaojie Zhang et al., "Above-room-temperature strong intrinsic ferromagnetism in 2D van der Waals Fe3GaTe2 with large perpendicular magnetic anisotropy", Nature Communications, Aug. 2022, pp. 1-8.
(Continued)

*Primary Examiner* — Matthew E. Hoban
(74) *Attorney, Agent, or Firm* — JCIPRNET

(57) ABSTRACT

The present invention provides a Ga-based van der Waals room-temperature ferromagnetic crystal material, preparation and use thereof, which belong to the technical field of nano magnetic material preparation. The materials include $Fe_{3-a}Ga_bTe_2$ (a=−0.3 to 0.1, b=0.8 to 1.2) and $Fe_{5-c}GeGa_dTe_2$ (c=−0.2 to 0.2, d=0.01 to 0.5). The growth method of $Fe_{3-a}Ga_bTe_2$ (a=−0.3 to 0.1, b=0.8 to 1.2) is a self-flux method, using excess Ga and Te as flux to grow crystals. The growth method of $Fe_{5-c}GeGa_dTe_2$ (c=−0.2 to 0.2, d=0.01 to 0.5) uses iodine as a transport agent to grow
(Continued)

crystals. The Ga-based van der Waals room-temperature ferromagnetic crystal $Fe_{3-a}Ga_bTe_2$ (a=−0.3 to 0.1, b=0.8 to 1.2) and $Fe_{5-c}GeGa_dTe_2$ (c=−0.2 to 0.2, d=0.01 to 0.5) materials have Curie temperature of 330 K to 367 K and 320 K to 345 K, and the saturation magnetic moments are 50 emu/g to 57.2 emu/g and 80 emu/g to 88.5 emu/g, respectively.

8 Claims, 5 Drawing Sheets

(51) Int. Cl.
    *C30B 9/06*      (2006.01)
    *C30B 29/46*      (2006.01)
    *H01F 1/147*      (2006.01)
    *B82Y 40/00*      (2011.01)

(52) U.S. Cl.
    CPC ............... *B82Y 25/00* (2013.01); *B82Y 40/00* (2013.01); *C01P 2002/50* (2013.01); *C01P 2002/72* (2013.01); *C01P 2004/20* (2013.01); *C01P 2006/32* (2013.01); *C01P 2006/42* (2013.01)

(56) References Cited

FOREIGN PATENT DOCUMENTS

| CN | 112921297 | 6/2021 |
|---|---|---|
| WO | 2021183049 | 9/2021 |

OTHER PUBLICATIONS

"International Search Report (Form PCT/ISA/210) of PCT/CN2022/136400," mailed on Apr. 6, 2023, pp. 1-5.

"Written Opinion of the International Searching Authority (Form PCT/ISA/237) of PCT/CN2022/136400," mailed on Mar. 31, 2023, with English translation thereof, pp. 1-10.

\* cited by examiner

GA-BASED VAN DER WAALS ROOM-TEMPERATURE FERROMAGNETIC CRYSTAL MATERIAL, PREPARATION AND USE THEREOF

CROSS-REFERENCE TO RELATED APPLICATION

This application is a 371 application of International PCT application serial no. PCT/CN2022/136400 filed on Dec. 3, 2022, which claims the priority benefit of China application no. 202210849612.2, filed on Jul. 19, 2022. The entirety of each of the above mentioned patent applications is hereby incorporated by reference herein and made a part of this specification.

TECHNICAL FIELD

The disclosure belongs to the technical field of nanoscale magnetic material preparation, and more specifically relates to a Ga-based van der Waals room-temperature ferromagnetic crystal material, preparation and use thereof.

DESCRIPTION OF RELATED ART

Originating from moving charges and spins of elementary particles, magnetism has revolutionized important technologies such as data storage and biomedical imaging, and continues to stimulate new application for emerging materials and reducing dimensions. Although ferromagnetic materials are able to exhibit ferromagnetic order in three-dimensional space, the limitations of the Mermin-Wagner theory hinder the realization of materials with intrinsic ferromagnetism in two-dimensional systems. The theorem points out through a rigorous proof that long-range magnetic order is impossible to exist in a two-dimensional isotropic Heisenberg spin system because thermodynamic fluctuations will destroy all ordered states. Until recently, breakthroughs have been made experimentally in studies of 2D ferromagnetic materials. Just in the past few years, ferromagnetic ordering has been observed in two-dimensional van der Waals crystals with van der Waals structures such as $CrI_3$, $Cr_2Ge_2Te_6$, $Fe_nGeTe_2$ (n=3, 4, 5). This series of two-dimensional van der Waals ferromagnetic crystals and their heterostructures not only involve rich physical mechanisms and interesting electronic properties, but also are expected to provide a research platform for a variety of exotic quantum effects, such as quantum anomalous Hall effect, quantum spin Hall effect and Valley Hall effect, etc., and provide a material basis for realization of various multifunctional quantum devices.

However, although the recently discovered two-dimensional van der Waals intrinsic ferromagnetic crystals have promoted the development of intrinsic two-dimensional magnetism and various multifunctional spintronic devices such as tunneling electron magnetic detection, spin quantum sensors, giant tunneling magnetoresistance, spin tunneling field-effect transistors, etc., due to their extremely low Curie temperature, these devices still only operate well below room temperature. Therefore, there is still a considerable level of challenge to prepare an intrinsic two-dimensional van der Waals ferromagnetic crystal with above-room-temperature Curie temperature, large saturation magnetic moment and large perpendicular magnetic anisotropy, and realize two-dimensional quantum device that is able to operate at room temperature based on the intrinsic two-dimensional van der Waals ferromagnetic crystal.

SUMMARY

The purpose of the present disclosure is to provide a type of Ga-based van der Waals room-temperature ferromagnetic crystal material and a preparation method in order to solve the above problems. By utilizing the present disclosure, it is possible to prepare high-quality Ga-based van der Waals room-temperature ferromagnetic crystal: $Fe_{3-a}Ga_bTe_2$ (a=−0.3~0.1, b=0.8~1.2) and $Fe_{5-c}GeGa_dTe_2$ (c=−0.2~0.2, d=0.01~0.5). Both $Fe_{3-a}Ga_bTe_2$ (a=−0.3~0.1, b=0.8~1.2) and $Fe_{5-c}GeGa_dTe_2$ (c=−0.2~0.2, d=0.01~0.5) crystals prepared by the present disclosure have a van der Waals structure, which may be easily exfoliated down to only a few layers. The Curie temperatures are higher than room temperature, respectively 330 K to 367 K and 320 K to 345 K, and the saturation magnetic moments are 50 emu/g to 57.2 emu/g and 80 emu/g to 88.5 emu/g, respectively. Specifically, the perpendicular magnetic anisotropy energy of $Fe_{3-a}Ga_bTe_2$ (a=−0.3~0.1, b=0.8~1.2) single crystal may be as high as $3.25\times10^5$ to $4.79\times10^5$ J/m$^3$. In addition, the thickness of two-dimensional $Fe_{3-a}Ga_bTe_2$ (a=−0.3~0.1, b=0.8~1.2) and $Fe_{5-c}GeGa_dTe_2$ (c=−0.2~0.2, d=0.01~0.5) nanosheets obtained through mechanical exfoliation is on the order of nanometers, the lateral size is on the order of microns, which is suitable for various current micro-nano processing techniques, and may be adopted to prepare various multifunctional two-dimensional quantum devices. The preparation method of a type of Ga-based van der Waals room-temperature ferromagnetic crystal materials described in the present disclosure has simple process, low cost, and good process stability. This disclosure is expected to facilitate the development and practical application of various multifunctional two-dimensional quantum devices based on Ga-based two-dimensional van der Waals room-temperature ferromagnetic crystals.

According to the first aspect of the present disclosure, a Ga-based van der Waals ferromagnetic crystal material is provided, the ferromagnetic crystal material is $Fe_{3-a}Ga_bTe_2$ ferromagnetic crystal, wherein a=−0.3 to 0.1, b=0.8 to 1.2; or $Fe_{5-c}GeGa_dTe_2$ ferromagnetic crystal, wherein c=−0.2 to 0.2, d=0.01 to 0.5.

Both the $Fe_{3-a}Ga_bTe_2$ compound of the $Fe_{3-a}Ga_bTe_2$ ferromagnetic crystal and the $Fe_{5-c}GeGa_dTe_2$ compound of the $Fe_{5-c}GeGa_dTe_2$ ferromagnetic crystal contain iron atoms with a valence of zero.

The Curie temperatures of the $Fe_{3-a}Ga_bTe_2$ ferromagnetic crystal and the $Fe_{5-c}GeGa_dTe_2$ ferromagnetic crystal are 330 K to 367 K and 320 K to 345 K respectively, and the $Fe_{3-a}Ga_bTe_2$ ferromagnetic crystal and the $Fe_{5-c}GeGa_dTe_2$ ferromagnetic crystal exhibit ferromagnetism below their respective Curie temperatures.

Preferably, the saturation magnetic moments of the $Fe_{3-a}Ga_bTe_2$ ferromagnetic crystal and the $Fe_{5-c}GeGa_dTe_2$ ferromagnetic crystal are 50 emu/g to 57.2 emu/g and 80 emu/g to 88.5 emu/g, respectively.

According to another aspect of the present disclosure, a method for preparing a ferromagnetic crystal is provided, including the following steps.

(1) Mixing Fe powder, Ga particles and Te powder thoroughly. The sum of the molar amount of Fe powder substance and Ga particles substance is equal to the molar amount of Te powder substance; the molar amount of Fe powder substance accounts for 40% to 60% of the sum of the molar amount of the Fe powder substance and Ga particles substance.

(2) Vacuumizing the container containing the mixture obtained in step (1).

(3) Heating the mixture, wherein the temperature of the heating is from 950° C. to 1050° C., and then the temperature of the heating is reduced during the crystal growth process to obtain $Fe_{3-a}Ga_bTe_2$ ferromagnetic crystals, wherein a=−0.3 to 0.1, b=0.8 to 1.2.

Preferably, the time of the heating is 24 hours to 48 hours.

Preferably, first the temperature of the heating is reduced rapidly to 880° C., wherein a rate is from 70° C./h to 170° C./h, then reduced slowly to 780° C., wherein a rate is from 0.5° C./h to 1.5° C./h, and then cooled naturally.

According to another aspect of the present disclosure, a method for preparing a ferromagnetic crystal is provided, including the following steps.

(1) Mixing Fe powder, Ge powder, Ga particles, Te powder and $I_2$ particles thoroughly, wherein the ratio of the molar amount of Fe powder substance, the sum of the molar amount of Ge powder substance and Ga particles substance, and the molar amount of Te powder substance is 4:1:2, and the molar amount of the Ge powder substance accounts for 40% to 60% of the sum of the molar amount of Ge powder substance and Ga particles substance.

(2) Vacuumizing the container containing the mixture obtained in step (1).

(3) Placing the part of the container containing the mixture in the high-temperature raw material zone in a dual-temperature zone tube furnace, and placing the part of the container not containing the mixture in the low-temperature crystallization zone in the dual-temperature zone tube furnace. The temperature in the high-temperature raw material zone is 950° C. to 1050° C., and the temperature in the low-temperature crystallization zone is 600° C. to 700° C. The $I_2$ particles serve as a transport agent, and the mixture is transported to the low-temperature crystallization zone for reaction to obtain $Fe_{5-c}GeGa_dTe_2$ ferromagnetic crystals, wherein c=−0.2 to 0.2, d=0.01 to 0.5.

Preferably, in step (3), the reaction time is 168 hours to 330 hours.

Preferably, the ratio of the mass of the $I_2$ particles to the volume of the container is 3 mg/cm³ to 9 mg/cm³.

According to another aspect of the present disclosure, a use of the Ga-based van der Waals ferromagnetic crystal material in a two-dimensional quantum device is provided.

Preferably, the two-dimensional quantum device is an anomalous Hall device or an electrically regulated magnetic device.

Generally speaking, compared with the related art, the above technical solution conceived by the present disclosure mainly has the following technical advantages.

(1) In the adopted self-flux method, the $Fe_{3-a}Ga_bTe_2$ (a=−0.3~0.1, b=0.8~1.2) bulk single crystal grown by slow cooling near the crystallization temperature has high purity and may be easily exfoliated to obtain few-layer two-dimensional nanosheets. The size is suitable for micro-nano processing techniques such as photolithography, and is suitable for the preparation of various multifunctional two-dimensional quantum devices.

(2) In the adopted chemical vapor transport method, iodine is used as a transport agent, and $Fe_{5-c}GeGa_dTe_2$ (c=−0.2~0.2, d=0.01~0.5) single crystal grown in the low-temperature crystallization zone of the quartz ampoule at a constant temperature has high purity, and may be easily exfoliated to obtain few-layer two-dimensional nanosheets. The size is suitable for micro-nano processing techniques such as photolithography, and is suitable for the preparation of various multifunctional two-dimensional quantum devices.

(3) With respect to $Fe_{3-a}Ga_bTe_2$ (a=−0.3~0.1, b=0.8~1.2), the ratio of raw materials as described in claims is adopted because sufficiently excess Ga and Te is required as fluxes to melt high melting point Fe, and Ga plays a more critical role, so the relationship between the molar amount of Fe and Ga in the raw material is further defined. With respect to $Fe_{5-c}GeGa_dTe_2$ (c=−0.2~0.2, d=0.01~0.5), the ratio of molar amount of raw material as described in claims is adopted because the four elements involved in the iodine element transport compound have different efficiency. For example, compared with Ge, Ga is more difficult to be transported, so even if the molar amount of Ga in the compound $Fe_{5-c}GeGa_dTe_2$ (c=−0.2~0.2, d=0.01~0.5) is much smaller than Ge, it is still required to put excess Ga into the raw material.

(4) The Curie temperatures of single crystals of a type of Ga-based van der Waals room-temperature ferromagnetic crystals $Fe_{3-a}Ga_bTe_2$ (a=−0.3~0.1, b=0.8~1.2) and $Fe_{5-c}GeGa_dTe_2$ (c=−0.2~0.2, d=0.01~0.5) are 330 K to 367 K and 320 K to 345 K, respectively. This above-room-temperature ferromagnetism comes from the zero-valence iron atoms contained in both materials.

$Fe_{3-a}Ga_bTe_2$ (a=−0.3~0.1, b=0.8~1.2) compound of $Fe_{3-a}Ga_bTe_2$ (a=−0.3~0.1, b=0.8~1.2) ferromagnetic crystal has an iron atom with zero valence, the theoretical Curie temperature of zero valence iron atom (i.e. iron element) is as high as 1043 K. However, in the compound, due to the difference in the crystal structure of $Fe_{3-a}Ga_bTe_2$ (a=−0.3~0.1, b=0.8~1.2) and $Fe_{5-c}GeGa_dTe_2$ (c=−0.2~0.2, d=0.01~0.5) single crystal and elemental iron, the Curie temperature is decreased but is still higher than 300 K, which is higher than most of the known van der Waals ferromagnetic crystals.

(5) A type of Ga-based van der Waals room-temperature ferromagnetic crystals prepared by the present disclosure all have relatively large saturation magnetic moments. Specifically, the saturation magnetic moment of $Fe_{3-a}Ga_bTe_2$ (a=−0.3~0.1, b=0.8~1.2) single crystal is 50 emu/g to 57.2 emu/g, and the saturation magnetic moment of $Fe_{5-c}GeGa_dTe_2$ (c=−0.2~0.2, d=0.01~0.5) single crystal is 80 emu/g to 88.5 emu/g, which is higher than most known two-dimensional van der Waals ferromagnetic crystals.

(6) The Ga-based van der Waals room-temperature ferromagnetic crystal $Fe_{3-a}Ga_bTe_2$ (a=−0.3~0.1, b=0.8~1.2) prepared in the present disclosure has large perpendicular magnetic anisotropy, and the perpendicular magnetic anisotropy energy is as high as $3.25 \times 10^5 \sim 4.79 \times 10^5$ J/m³ at 300 K, which is higher than most widely-used ferromagnetic thin film materials.

(7) The size of two-dimensional nanosheets obtained by mechanical exfoliation of $Fe_{3-a}Ga_bTe_2$ (a=−0.3~0.1, b=0.8~1.2) and $Fe_{5-c}GeGa_dTe_2$ (c=−0.2~0.2, d=0.01~0.5) single crystals is on the order of microns and the thickness is on the order of nanometers, which allows micro-nano processing technology such as lithography to be better performed on materials, makes it possible to realize anomalous Hall devices, electrically regulated magnetic devices, etc., and has broad application prospects in the field of two-dimensional quantum devices.

DESCRIPTION OF THE EMBODIMENTS

Figure 1:
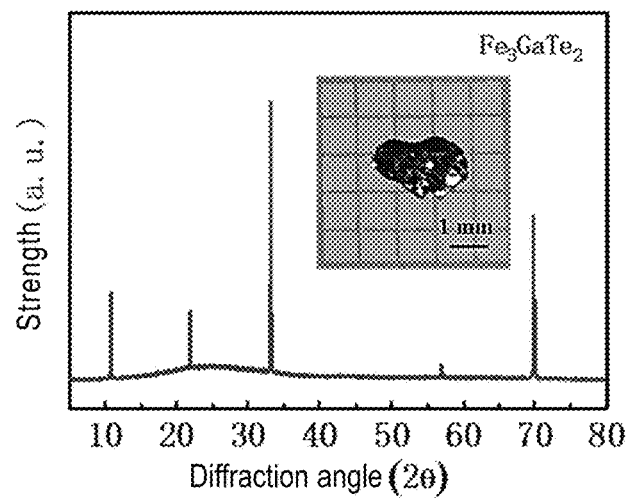
FIG. 1 is an X-ray diffraction spectrum of a Ga-based two-dimensional van der Waals room-temperature ferromagnetic $Fe_3GaTe_2$ single crystal of Example 1.

In order to make the purpose, technical solution and advantages of the present disclosure clearer, the present disclosure will be further described in detail below in conjunction with the accompanying drawings and embodiments. It should be understood that the specific embodiments described here are only used to explain the present disclosure, not to limit the present disclosure. In addition, the technical features involved in the various embodiments of the present disclosure described below can be combined with each other as long as they do not constitute a conflict with each other.

With regard to a type of Ga-based van der Waals room-temperature ferromagnetic crystal material and preparation of the same in the present disclosure, the preparation method of the material is as follows.

With respect to $Fe_{3-a}Ga_bTe_2$ (a=−0.3~0.1, b=0.8~1.2):

1) Step 1: Fe powder (99.99%), Ga particles (99.999%), and Te powder (99.999%) with a particular molar ratio are put into the bottom of a quartz ampoule. A particular molar ratio refers to that the sum of the molar amount Fe powder substance and Ga particles substance is equal to the molar amount of Te powder substance; the molar amount of the Fe powder substance accounts for 40% to 60% of the sum of the molar amount of Fe powder substance and Ga particles substance.

2) Step 2: The ampoule is vacuumized and sealed.

3) Step 3: The ampoule is placed in a muffle furnace. The temperature is raised to a range from 950° C. to 1050° C. within 1 hour to 5 hours and kept warm for 1 day to 2 days, then rapidly cooled down to 880° C. and slowly cooled down to 780° C. at a rate of 0.5° C./h to 1.5° C./h. Then the program ends, and the ampoule is naturally cooled to room temperature with the furnace.

With respect to $Fe_{5-c}GeGa_dTe_2$ (c=−0.2~0.2, d=0.01~0.5):

1) Step 1: Fe powder (99.99%), Ge powder (99.999%), Ga particles (99.999%), Te powder (99.999%) with a particular molar ratio and $I_2$ particles (99.99%) with a particular mass are put into the bottom of the quartz ampoule. A particular molar ratio refers to that the ratio of the molar amount of the Fe powder substance, the sum of the molar amount of the Ge powder substance and the Ga particles substance, and the molar amount of the Te powder substance is 4:1:2, and the molar amount of the Ge powder substance accounts for 40% to 60% of the sum of the molar amount of Ge powder substance and Ga particles substance.

2) Step 2: The ampoule is vacuumized and sealed.

3) Step 3: The ampoule bottle is placed in a dual-temperature zone tube furnace, the raw material end is a high-temperature raw material zone, and the other end is a low-temperature crystallization zone. The high-temperature zone and the low-temperature zone are respectively heated to 950° C. to 1050° C. and 600° C. to 700° C. within 1 hour to 5 hours and kept warm for 1 week to 2 weeks and cooled down to room temperature naturally.

In some embodiments, the size of the Ga particles is 1 mm to 10 mm, and the volume is 0.1 $cm^3$ to 0.5 $cm^3$; the diameter of the $I_2$ particles is 1 mm to 3 mm, and the ratio of the mass of the $I_2$ particles to the volume of the container is 3 $mg/cm^3$ to 9 $mg/cm^3$, the powder size of the Fe, Ge, Te is 100 mesh to 300 mesh.

In some embodiments, the vacuumizing and sealing processes of the quartz tube are as follows: a mechanical pump is pumped to a vacuum below 1 Pa, then washed with argon gas with a purity of 99.999% for thee times to remove the oxygen from the quartz tube, and finally sealed with oxy-hydrogen flame.

In some embodiments, the quartz ampoule for growing $Fe_{3-a}Ga_bTe_2$ (a=−0.3~0.1, b=0.8~1.2) has a diameter of 2 cm and a length of 10 cm. The quartz ampoule for growing $Fe_{5-c}GeGa_dTe_2$ (c=−0.2~0.2, d=0.01~0.5) has a diameter of 2 cm to 5 cm and a length of 40 cm.

In some embodiments, the crystal material sizes of the $Fe_{3-a}Ga_bTe_2$ (a=−0.3~0.1, b=0.8~1.2) and $Fe_{5-c}GeGa_dTe_2$ (c=−0.2~0.2, d=0.01~0.5) are 2~3 "×"1~2"×"0.1~0.5 mm and 6"×"4"×"0.1~0.5 mm.

With regard to a type of Ga-based van der Waals room-temperature ferromagnetic crystal material and preparation method for the same in the present disclosure, the $Fe_{3-a}Ga_bTe_2$ (a=−0.3~0.1, b=0.8~1.2) and $Fe_{5-c}GeGa_dTe_2$ (c=−0.2~0.2, d=0.01~0.5) crystal materials are all high-quality room-temperature ferromagnetic compounds, which have a van der Waals structure and are easily exfoliated mechanically. The crystal materials are silvery white, and may be exfoliated into flat and thin sheet-like two-dimensional nanocrystals, which may be used to prepare various multifunctional two-dimensional quantum devices; the materials are all single crystals.

A type of Ga-based van der Waals room-temperature ferromagnetic crystal material and preparation method for the same in the present disclosure will now be further described in detail in conjunction with the following specific examples and accompanying drawings.

Example 1

1) The high-purity Fe powder, Ga particles and Te powder were weighted with a molar ratio of 1:1:2, and poured into the bottom of the quartz ampoule respectively and vacuumed for sealing.

2) The sealed ampoule was placed in the muffle furnace. The temperature was raised to 1000° C. within 1 hour and kept warm for 1 day, then quickly cooled down to 880° C. at a rate of 100° C./h and slowly cooled down to 780° C. at a rate of 1° C./h. Then the program was finished, and the ampoule was naturally cooled to room temperature with the furnace to obtain $Fe_3GaTe_2$ single crystal.

Example 2

1) The high-purity Fe powder, Ga particles and Te powder were weighted with a molar ratio of 0.8:1.2:2, and poured into the bottom of the quartz ampoule respectively and vacuumed for sealing.

2) The sealed ampoule was placed in the muffle furnace. The temperature was raised to 1000° C. within 1 hour and kept warm for 1 day, then quickly cooled down to 880° C. at a rate of 100° C./h and slowly cooled down to 780° C. at a rate of 1° C./h. Then the program was finished, and the ampoule was naturally cooled to room temperature with the furnace to obtain $Fe_{2.9}Ga_{1.2}Te_2$ single crystal.

Example 3

1) The high-purity Fe powder, Ga particles and Te powder were weighted with a molar ratio of 1.2:0.8:2, and poured into the bottom of the quartz ampoule respectively and vacuumed for sealing.

2) The sealed ampoule was placed in the muffle furnace. The temperature was raised to 1000° C. within 1 hour and kept warm for 1 day, then quickly cooled down to 880° C. at a rate of 100° C./h and slowly cooled down to 780° C. at a rate of 1° C./h. Then the program was finished, and the ampoule was naturally cooled to room temperature with the furnace to obtain $Fe_{3.3}Ga_{0.8}Te_2$ single crystal.

Example 4

1) The high-purity Fe powder, Ge powder, Ga particles and Te powder were weighted with a molar ratio of 8:1:1:4, the $I_2$ particles were weighted with a mass of 0.3 g, and poured into the bottom of the quartz ampoule respectively and vacuumized for sealing.

2) The sealed ampoule bottle was placed in a dual-temperature zone tube furnace, the raw material end is a high-temperature raw material zone, and the other end is a low-temperature crystallization zone. The high-temperature zone and the low-temperature zone were respectively heated to 1000° C. and 650° C. within 1 hour and kept warm for 2 weeks and cooled down to room temperature naturally, and $Fe_5GeGa_{0.1}Te_2$ single crystal was obtained in low-temperature crystallization zone.

Example 5

1) The high-purity Fe powder, Ge powder, Ga particles and Te powder were weighted with a molar ratio of 8:1.2:0.8:4, the $I_2$ particles were weighted with a mass of 0.3 g, and poured into the bottom of the quartz ampoule respectively and vacuumized for sealing.

2) The sealed ampoule bottle was placed in a dual-temperature zone tube furnace, the raw material end is a high-temperature raw material zone, and the other end is a low-temperature crystallization zone. The high-temperature zone and the low-temperature zone were respectively heated to 1000° C. and 650° C. within 1 hour and kept warm for 2 weeks and cooled down to room temperature naturally, and $Fe_{5.2}GeGa_{0.01}Te_2$ single crystal was obtained in low-temperature crystallization zone.

Example 6

1) The high-purity Fe powder, Ge powder, Ga particles and Te powder were weighted with a molar ratio of 8:0.8:1.2:4, the $I_2$ particles were weighted with a mass of 0.3 g, and poured into the bottom of the quartz ampoule respectively and vacuumized for sealing.

2) The sealed ampoule bottle was placed in a dual-temperature zone tube furnace, the raw material end is a high-temperature raw material zone, and the other end is a low-temperature crystallization zone. The high-temperature zone and the low-temperature zone were respectively heated to 1000° C. and 650° C. within 1 hour and kept warm for 2 weeks and cooled down to room temperature naturally, and $Fe_{4.8}GeGa_{0.5}Te_2$ single crystal was obtained in low-temperature crystallization zone.

Figure 2:
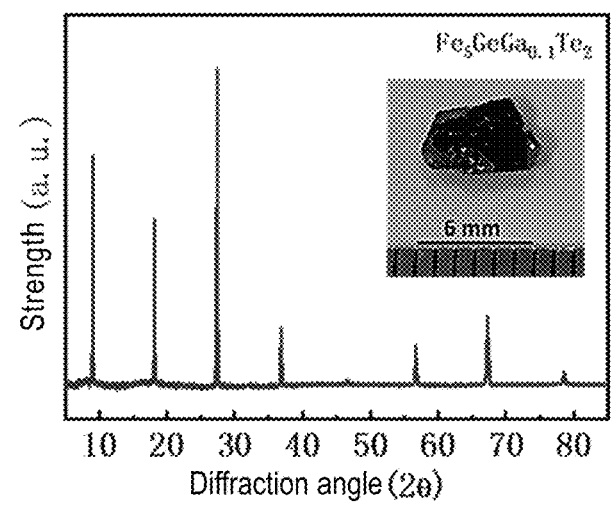
FIG. 2 is an X-ray diffraction spectrum of a Ga-based two-dimensional van der Waals room-temperature ferromagnetic $Fe_5GeGa_{0.1}Te_2$ single crystal in Example 4.
Figure 3:
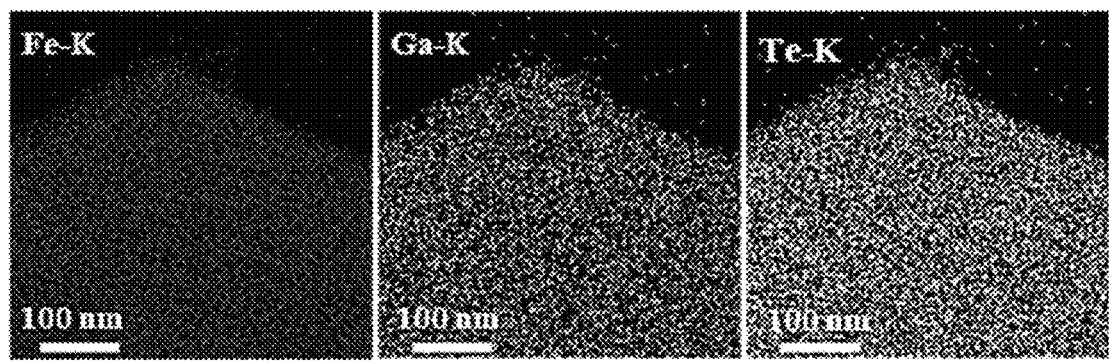
FIG. 3 is an energy spectrum element distribution diagram of Ga-based two-dimensional van der Waals room-temperature ferromagnetic crystal $Fe_3GaTe_2$ nanosheets in Example 1.
Figure 4:
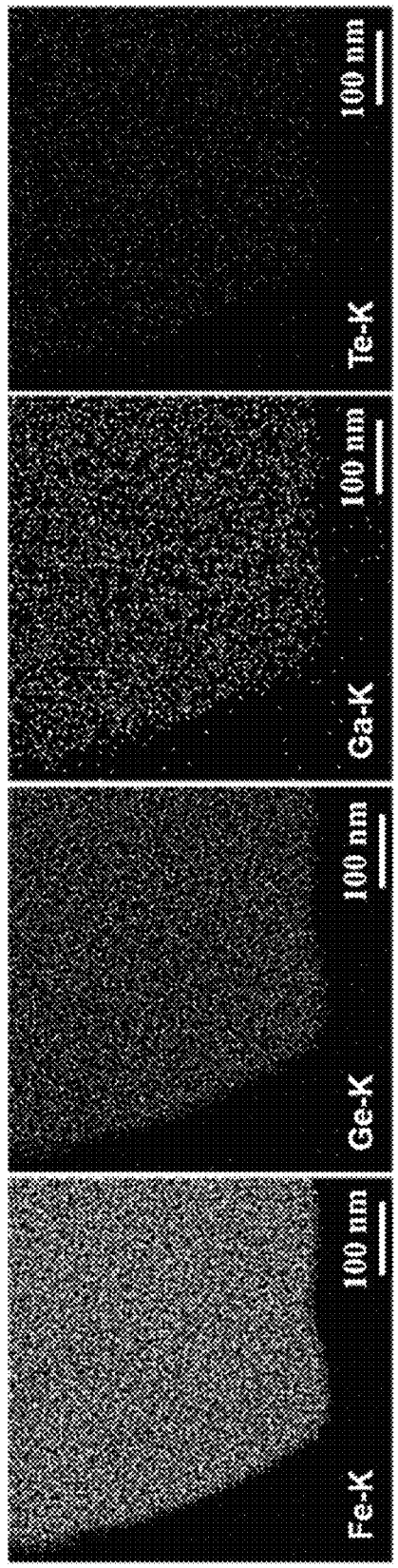
FIG. 4 is an energy spectrum element distribution diagram of Ga-based two-dimensional van der Waals room-temperature ferromagnetic crystal $Fe_5GeGa_{0.1}Te_2$ nanosheets in Example 4.
Figure 5:
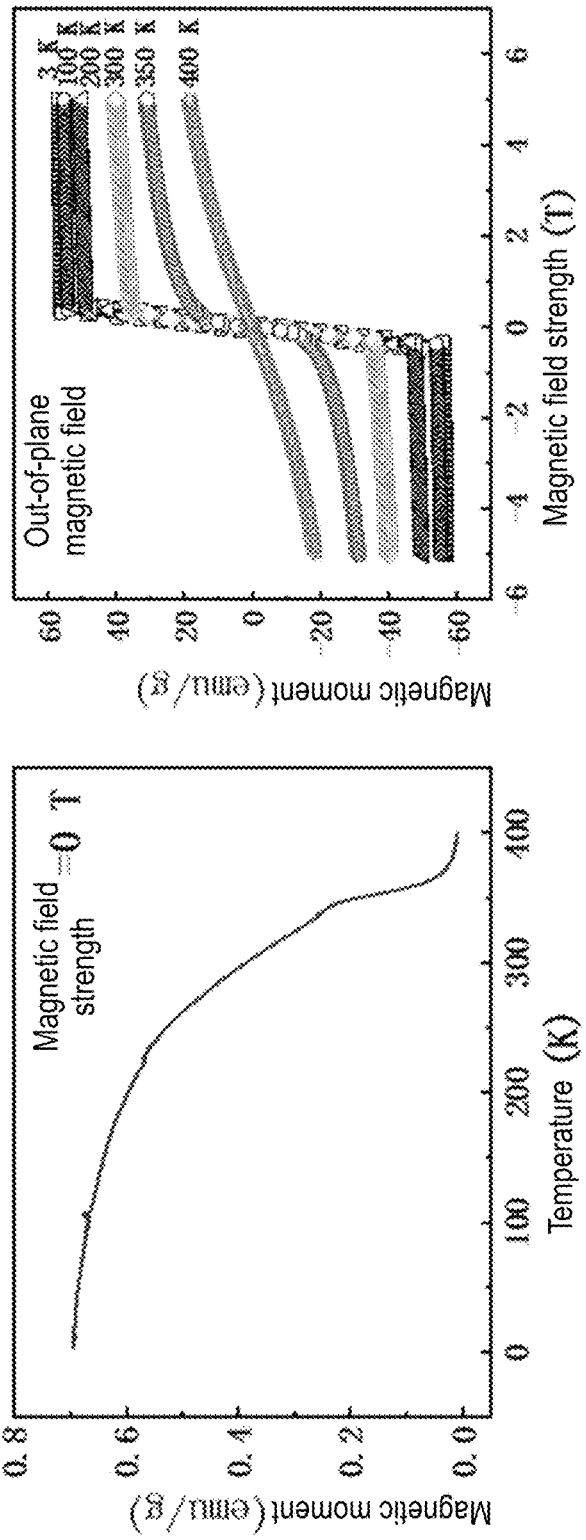
FIG. 5 shows a spontaneous magnetization curve, and hysteresis loops under out-of-plane magnetic field at different temperatures of a Ga-based two-dimensional van der Waals room-temperature ferromagnetic $Fe_3GaTe_2$ single crystal of Example 1.
Figure 6:
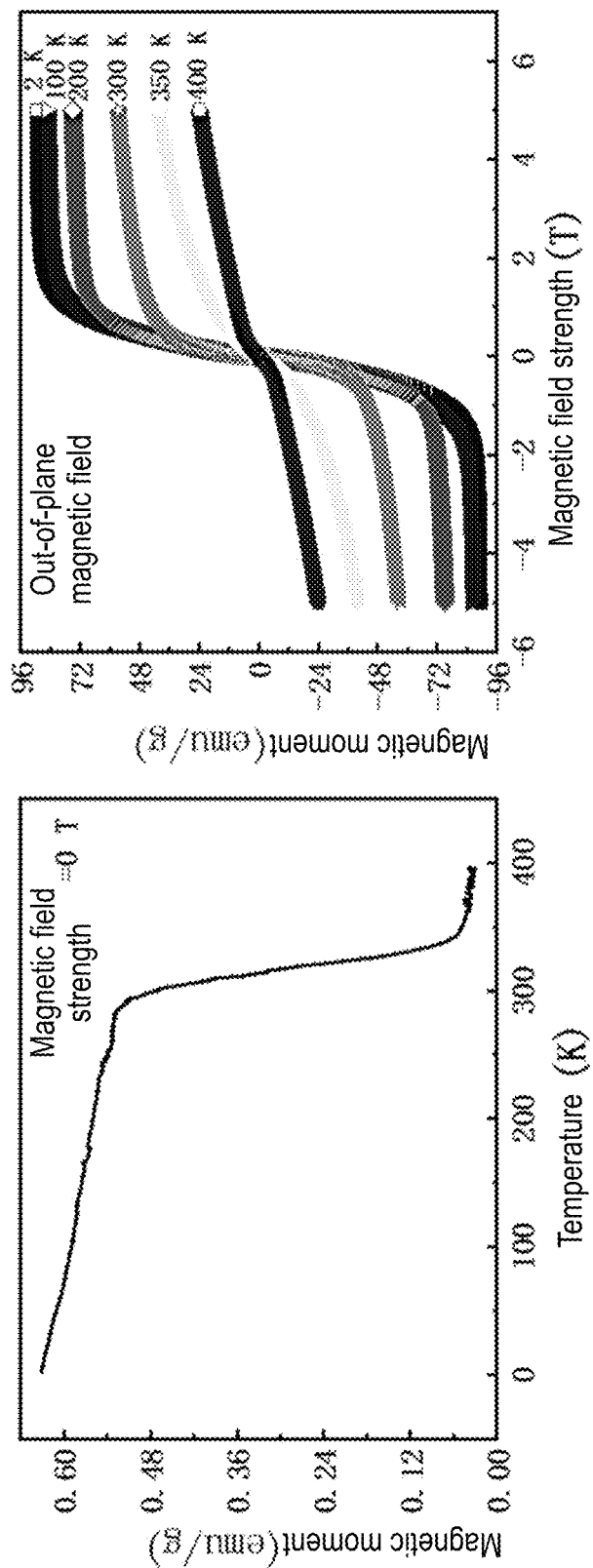
FIG. 6 shows a spontaneous magnetization curve, and hysteresis loops under out-of-plane magnetic field at different temperatures of a Ga-based two-dimensional van der Waals room-temperature ferromagnetic $Fe_5GeGa_{0.1}Te_2$ single crystal of Example 4.
Figure 7:
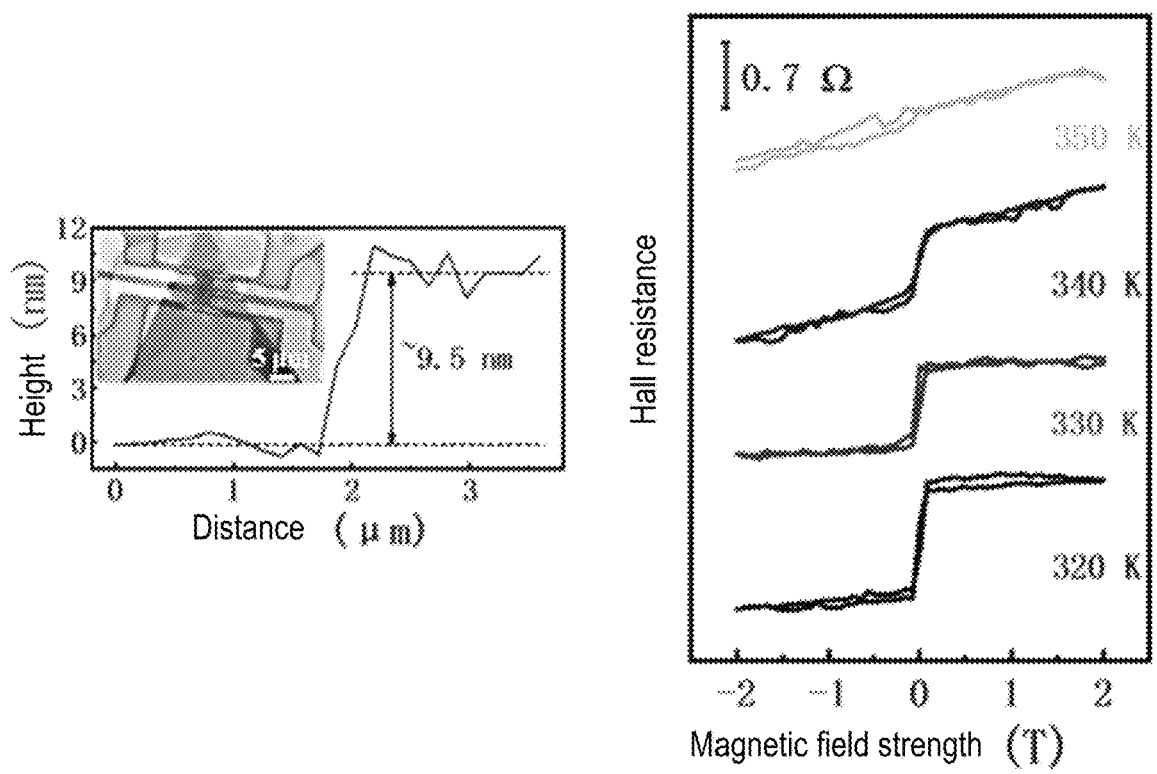
FIG. 7 shows an anomalous Hall device and above-room-temperature anomalous Hall effect based on a Ga-based two-dimensional van der Waals room-temperature ferromagnetic crystal $Fe_3GaTe_2$ nanosheets in Example 1.
Figure 8:
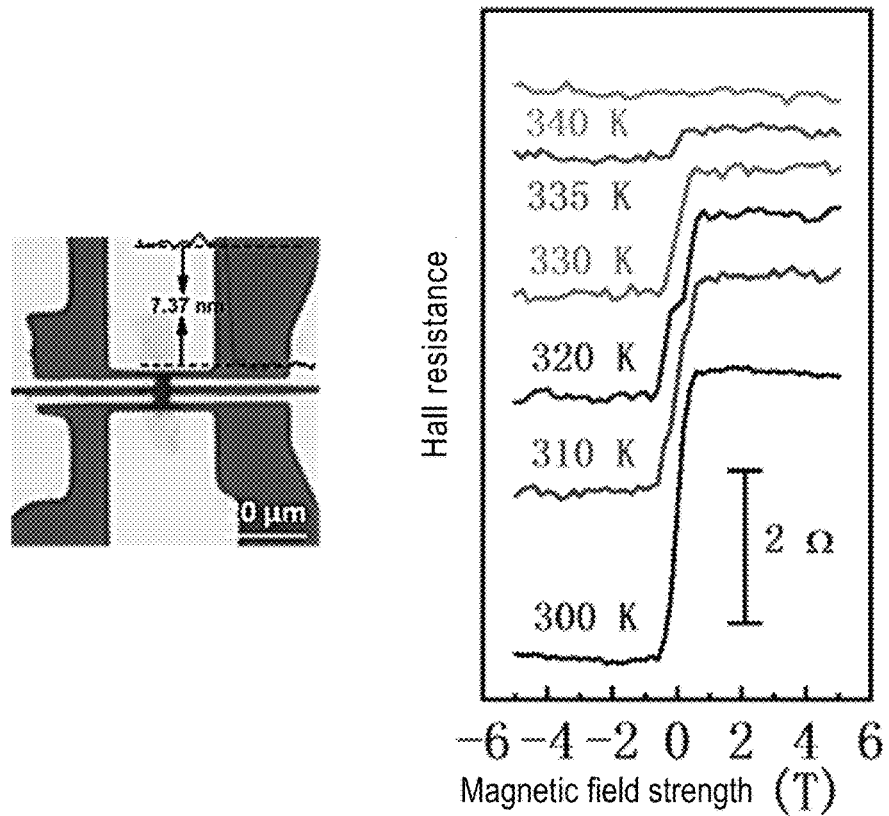
FIG. 8 shows an anomalous Hall device and above-room-temperature anomalous Hall effect based on Ga-based two-dimensional van der Waals room-temperature ferromagnetic crystal $Fe_5GeGa_{0.1}Te_2$ nanosheets in Example 4.
Figure 9:
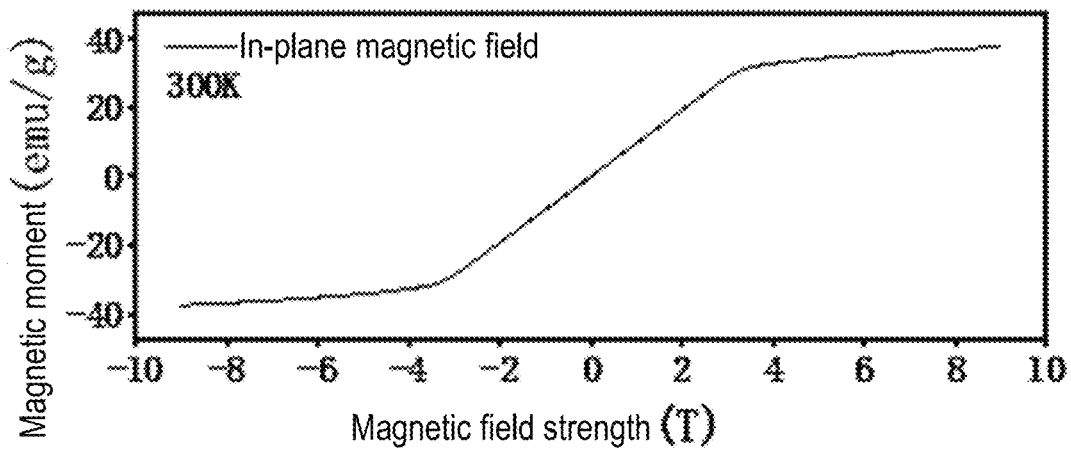
FIG. 9 shows a hysteresis loop under in-plane magnetic field at 300K of a Ga-based two-dimensional van der Waals room-temperature ferromagnetic $Fe_3GaTe_2$ single crystal in Example 1.
Figure 10:
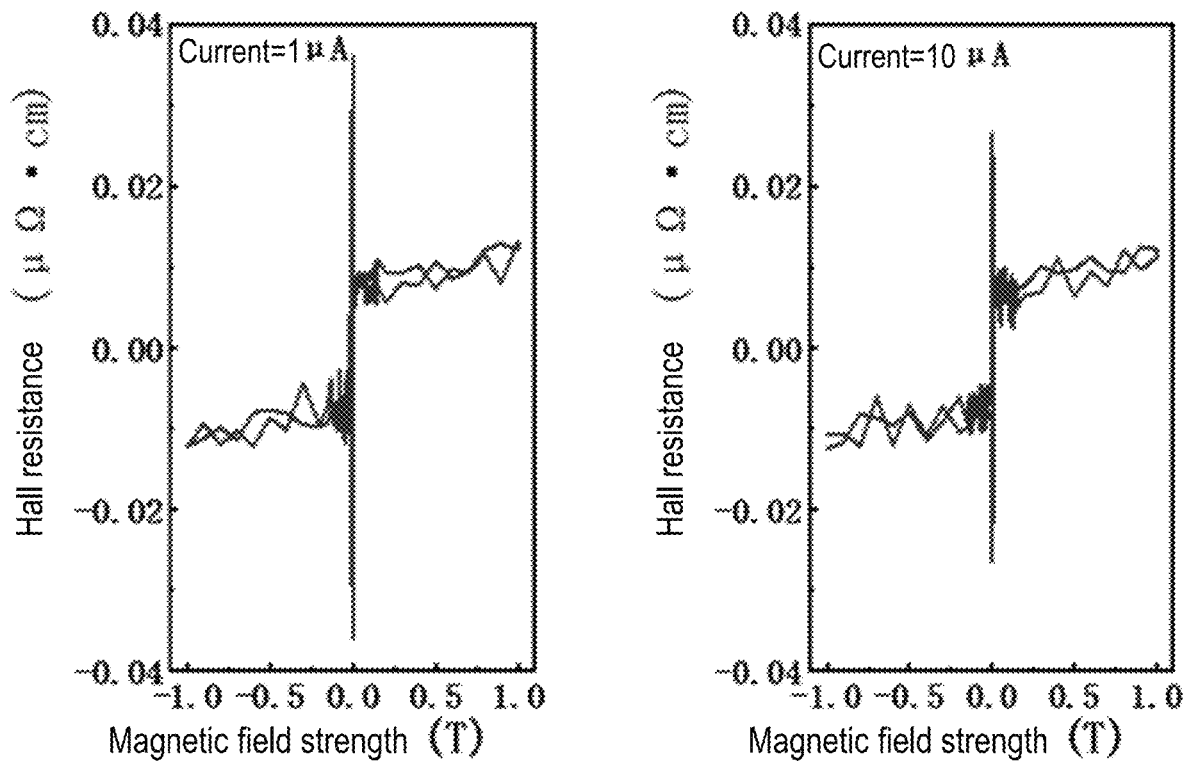
FIG. 10 shows an electrically regulated magnetism curve graph of a Ga-based two-dimensional van der Waals room-temperature ferromagnetic crystal $Fe_3GaTe_2$ single crystal in Example 1.

FIG. 1 is an X-ray diffraction spectrum of $Fe_3GaTe_2$ single crystal. After comparing FIG. 1 with the theoretical X-ray diffraction spectrum, it can be seen that the equidistant diffraction peaks in the X-ray diffraction spectrum of $Fe_3GaTe_2$ single crystal correspond to the (001) crystal plane, and no impurity peaks are observed, which indicates that the synthesized $Fe_3GaTe_2$ single crystal has high crystal quality and strict growth orientation. FIG. 2 is an X-ray diffraction spectrum of $Fe_5GeGa_{0.1}Te_2$ single crystal. After comparing FIG. 2 with the theoretical X-ray diffraction spectrum, it can be seen that the equidistant diffraction peaks in the X-ray diffraction spectrum of $Fe_5GeGa_{0.1}Te_2$ single crystal correspond to the (001) crystal plane, and no impurity peaks are observed, which indicates that the synthesized $Fe_5GeGa_{0.1}Te_2$ single crystal has high crystal quality and strict growth orientation. FIG. 3 is an energy spectrum element distribution diagram of $Fe_3GaTe_2$ nanosheets, and energy spectrum analysis shows that Fe, Ga, and Te elements are evenly distributed in $Fe_3GaTe_2$. FIG. 4 is an energy spectrum element distribution diagram of $Fe_5GeGa_{0.1}Te_2$ nanosheets, and energy spectrum analysis shows that the Fe, Ge, Ga, and Te elements are evenly distributed in $Fe_5GeGa_{0.1}Te_2$. FIG. 5 shows a spontaneous magnetization curve, and hysteresis loops under out-of-plane magnetic field at different temperatures of $Fe_3GaTe_2$ single crystal, which shows intrinsic above-room-temperature ferromagnetism and large saturation magnetic moment of $Fe_3GaTe_2$ single crystal. FIG. 6 shows a spontaneous magnetization curve, and hysteresis loops under out-of-plane magnetic field at different temperatures of $Fe_5GeGa_{0.1}Te_2$ single crystal, which shows intrinsic above-room-temperature ferromagnetism and large saturation magnetic moment of $Fe_5GeGa_{0.1}Te_2$ single crystal. FIG. 7 shows an anomalous Hall device and above-room-temperature anomalous Hall effect of $Fe_3GaTe_2$ nanosheets, which shows the easy-exfoliating characteristics of $Fe_3GaTe_2$ single crystal, intrinsic above-room-temperature ferromagnetism and the application potential of two-dimensional quantum devices. FIG. 8 shows an anomalous Hall device and above-room-temperature anomalous Hall effect of $Fe_5GeGa_{0.1}Te_2$ nanosheets, which shows the easy-exfoliating characteristics of $Fe_5GeGa_{0.1}Te_2$ single crystal, intrinsic above-room-temperature ferromagnetism and the application potential of two-dimensional quantum devices. FIG. 9 shows a hysteresis loop under in-plane magnetic field at 300 K of a Ga-based two-dimensional van der Waals room-temperature ferromagnetic $Fe_3GaTe_2$ single crystal in Example 1. Based on FIG. 9, it can be calculated that the perpendicular magnetic anisotropy energy of $Fe_3GaTe_2$ at 300 K is as high as $4.79\times10^5$ $J/m^3$. FIG. 10 shows an electrically regulated magnetism curve graph of a Ga-based two-dimensional van der Waals room-temperature ferromagnetic $Fe_3GaTe_2$ single crystal in Example 1. FIG. 10 shows that the current flowing through the device has an obvious adjustment effect on the Hall resistance of the sample, exhibiting an application prospect thereof in the field of two-dimensional quantum devices.

It is easy for those skilled in the art to understand that the above descriptions are only preferred embodiments of the present disclosure, and are not intended to limit the present disclosure. Any modifications, equivalent replacements and improvements made within the spirit and principles of the present disclosure should all be included within the protection scope of the present disclosure.

What is claimed is:

1. A Ga-based van der Waals ferromagnetic crystal material, wherein the ferromagnetic crystal material is a $Fe_{3-a}Ga_bTe_2$ ferromagnetic crystal, wherein a=−0.3 to 0.1, b=0.8 to 1.2; or a $Fe_{5-c}GeGa_dTe_2$ ferromagnetic crystal, wherein c=−0.2 to 0.2, d=0.01 to 0.5;
   wherein both a $Fe_{3-a}Ga_bTe_2$ compound of the $Fe_{3-a}Ga_bTe_2$ ferromagnetic crystal and a $Fe_{5-c}GeGa_dTe_2$ compound of the $Fe_{5-c}GeGa_dTe_2$ ferromagnetic crystal contain iron atoms with a valence of zero;
   wherein Curie temperatures of the $Fe_{3-a}Ga_bTe_2$ ferromagnetic crystal and the $Fe_{5-c}GeGa_dTe_2$ ferromagnetic crystal are 330 K to 367 K and 320 K to 345 K respectively, and the $Fe_{3-a}Ga_bTe_2$ ferromagnetic crystal and the $Fe_{5-c}GeGa_dTe_2$ ferromagnetic crystal exhibit ferromagnetism below their respective Curie temperatures.

2. The Ga-based van der Waals ferromagnetic crystal material according to claim 1, wherein saturation magnetic moments of the $Fe_{3-a}Ga_bTe_2$ ferromagnetic crystal and the $Fe_{5-c}GeGa_dTe_2$ ferromagnetic crystal are 50 emu/g to 57.2 emu/g and 80 emu/g to 88.5 emu/g, respectively.

3. A method for preparing a ferromagnetic crystal, comprising following steps:
   (1) mixing Fe powder, Ga particles and Te powder thoroughly, a sum of a molar amount of the Fe powder and the Ga particles is equal to a molar amount of the Te powder; the molar amount of the Fe powder accounts for 40% to 60% of the sum of the molar amount of the Fe powder and the Ga particles;
   (2) vacuumizing a container containing a mixture obtained in step (1); and
   (3) heating the mixture, wherein a temperature of the heating is from 950° C. to 1050° C., and then the temperature of the heating is reduced during a crystal growth process to obtain a $Fe_{3-a}Ga_bTe_2$ ferromagnetic crystal, wherein a=−0.3 to 0.1, b=0.8 to 1.2.

4. The method for preparing the ferromagnetic crystal according to claim 3, wherein a time of the heating is 24 hours to 48 hours.

5. The method for preparing the ferromagnetic crystal according to claim 3, wherein first the temperature of the heating is reduced rapidly to 880° C., wherein a rate is from 70° C./h to 170° C./h, then reduced slowly to 780° C., wherein a rate is from 0.5° C./h to 1.5° C./h, and then cooled naturally.

6. A method for preparing a ferromagnetic crystal, comprising following steps:
   (1) mixing Fe powder, Ge powder, Ga particles, Te powder and $I_2$ particles thoroughly, wherein a ratio of a molar amount of the Fe powder, a sum of a molar amount of the Ge powder and the Ga particles, and a molar amount of the Te powder is 4:1:2, and the molar amount of the Ge powder accounts for 40% to 60% of the sum of the molar amount of the Ge powder and the Ga particles;
   (2) vacuumizing a container containing a mixture obtained in step (1); and
   (3) placing a part of the container containing the mixture in a high-temperature raw material zone in a dual-temperature zone tube furnace and placing a part of the container not containing the mixture in a low-temperature crystallization zone in the dual-temperature zone tube furnace, wherein a temperature in the high-temperature raw material zone is 950° C. to 1050° C., and a temperature in the low-temperature crystallization zone is 600° C. to 700° C.; wherein the $I_2$ particles serve as a transport agent; and transporting the mixture to the low-temperature crystallization zone for reaction to obtain a $Fe_{5-c}GeGa_dTe_2$ ferromagnetic crystal, wherein c=−0.2 to 0.2, d=0.01 to 0.5.

7. The method for preparing the ferromagnetic crystal according to claim 6, wherein in step (3), a time of the reaction is 168 hours to 330 hours.

8. The method for preparing the ferromagnetic crystal according to claim 6, wherein a ratio of a mass of the $I_2$ particles to a volume of the container is 3 $mg/cm^3$ to 9 $mg/cm^3$.

* * * * *